United States Patent [19]
Frahm et al.

[11] Patent Number: 6,081,020
[45] Date of Patent: Jun. 27, 2000

[54] LINEAR PIN PHOTODIODE

[75] Inventors: Robert Eugene Frahm, Flemington; Keon M. Lee, Bellemead; Orval George Lorimor, Warren; Dennis Ronald Zolnowski, Bridgewater, all of N.J.

[73] Assignee: Lucent Technologies Inc., Murray Hill, N.J.

[21] Appl. No.: 09/027,031

[22] Filed: Feb. 20, 1998

[51] Int. Cl.[7] .................. H01L 31/075; H01L 31/105; H01L 31/117
[52] U.S. Cl. .............................. 257/458; 257/656
[58] Field of Search ...................... 257/458, 656

[56] References Cited

U.S. PATENT DOCUMENTS

| | | | |
|---|---|---|---|
| 5,061,977 | 10/1991 | Funaba | 257/464 |
| 5,594,237 | 1/1997 | Kulick | 250/214.1 |
| 5,596,186 | 1/1997 | Kobayashi | 250/214.1 |

*Primary Examiner*—David Hardy
*Assistant Examiner*—Allan Wilson
*Attorney, Agent, or Firm*—Steven Bartholomew; Stephen M. Gurey

[57] ABSTRACT

An improved PIN photodiode provides enhanced linearity by confining the light absorption region of the diode wholly within the depletion region. The photodiode exhibits improved linearity over prior art designs because the thickness of the absorption region is no longer a function of changes in the size of the depletion region during device operation. Keeping the absorption region wholly within the depletion region ensures that the charge carriers generated by incident illumination will increase the conductivity of the semiconductor material.

11 Claims, 1 Drawing Sheet

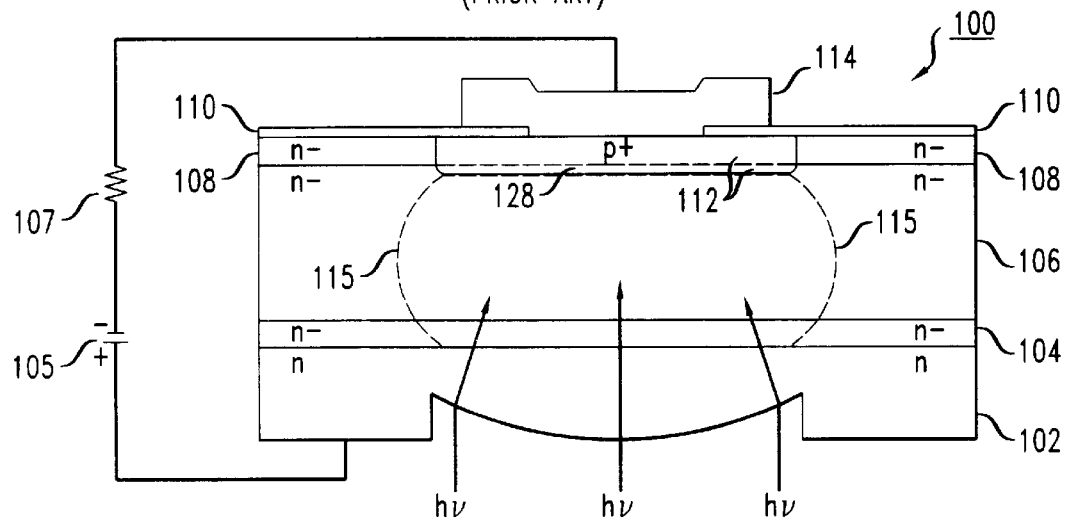
*FIG. 1*
*(PRIOR ART)*
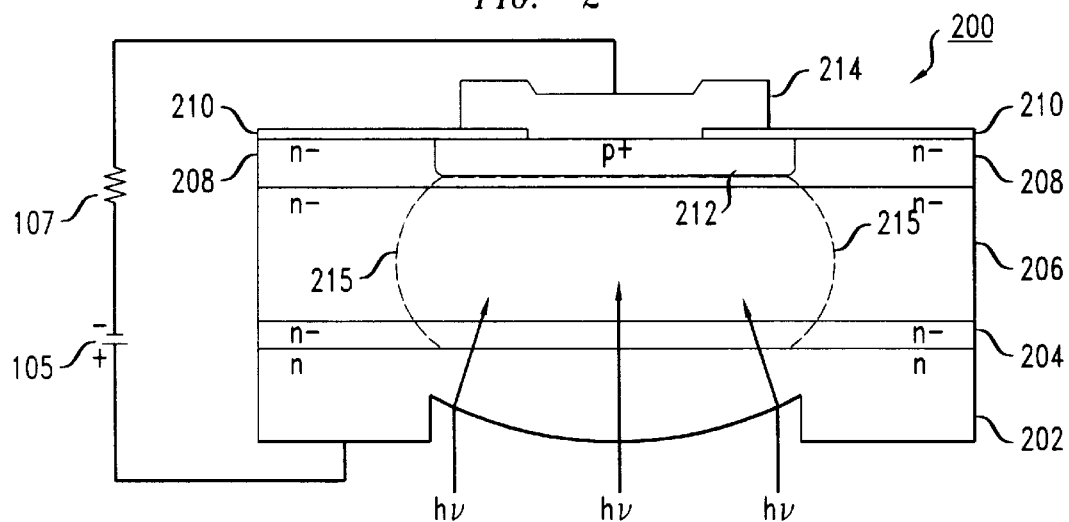
*FIG. 2*
*FIG. 3*
|     | 10V  | 20V  | 30V  | 40V  | 50V  |
|-----|------|------|------|------|------|
| I-1 | 48.2 | 72.9 | 76.5 | 75.4 | 74.7 |
| I-2 | 61.4 | 78.5 | 78.6 | 79.3 | 79.9 |
| I-3 | 31.3 | 73.7 | 76.8 | 76.8 | 75.8 |
| I-4 | 49.3 | 74.8 | 77.1 | 76.9 | 75.7 |
| I-5 | 37.1 | 74.8 | 75.0 | 76.6 | 75.8 |
| P-1 | 65.8 | 70.3 | 72.0 | 72.1 | 68.0 |

LINEAR PIN PHOTODIODE

BACKGROUND

1. Field of the Invention

The invention relates generally to semiconducting devices and, more specifically, to PIN photodetector diodes.

2. Description of Related Art

Existing PIN diodes include an absorption region in which incident illumination generates electron-hole charge carriers, and a depletion region in which the density of charge carriers is insufficient to neutralize the fixed charge density of donors and acceptors. Light incident upon the depletion region causes a change in PIN photodiode conductivity. In the context of optical communications, this conductivity change has been advantageously exploited to detect multichannel signals carried on fiber optic cables. Unfortunately, however, presently-existing PIN photodiodes exhibit insufficient linearity when conductivity is measured as a function of illumination. This shortcoming is apparent when the photodiode is employed in the context of cable television to process a plurality of frequency-division-multiplexed, amplitude-modulated vestigial-sideband (AM-VSB) video signals. Nonlinearities in photodiode conductivity as a function of illumination distort the envelope of VSB video signals, providing a degraded video signal at the customer premises.

SUMMARY OF THE INVENTION

The invention is based upon our discovery that presently-existing PIN diodes are nonlinear because some of the charge carriers generated by illumination do not change the conductivity of the diode. In particular, charge carriers generated outside of the depletion region become trapped by semiconductor donors and acceptors, and are thus unable to enhance photodiode conductivity. Due to the fact that existing PIN diodes absorb some light in areas outside of the depletion region, and this light absorption does not lead to a corresponding change in conductivity, the photodiode exhibits nonlinearities.

A further complication is that the boundaries of the depletion region change dynamically during photodiode operation, thereby rendering linearity all the more difficult to achieve.

In view of the foregoing, an improved PIN photodiode embodying the principles of the invention provides enhanced linearity by confining the light absorption region of the diode wholly within the diode's charge carrier depletion region. The photodiode exhibits improved linearity over prior art designs because the thickness of the absorption region is no longer a function of changes in the size of the depletion region during device operation. Keeping the absorption region wholly within the depletion region ensures that a greater number of the charge carriers generated by incident illumination will increase the conductivity of the semiconductor material relative to prior art designs.

BRIEF DESCRIPTION OF THE DRAWINGS

FIG. 1 is a structural diagram of a prior art PIN photodiode.

FIG. 2 is a structural diagram of an illustrative PIN photodiode embodying the principles of the invention.

FIG. 3 is a chart showing the measured linearities of a prior-art PIN photodiode and a PIN photodiode constructed in accordance with the principles of the invention.

DETAILED DESCRIPTION OF THE PREFERRED EMBODIMENTS

FIG. 1 is a structural diagram of a prior art PIN photodiode 100. (Note that FIG. 1, as well as FIG. 2, are conceptual drawings and, as such, are not drawn to scale. Selection of appropriate physical dimensions is a matter well-known to those skilled in the art.) PIN photodiode 100 is fabricated on an n-doped InP substrate 102. This material is transparent to light in the wavelength range of 1.3 to 1.55 microns. A first intrinsic layer 104 of undoped InP is epitaxially grown on substrate 102, such that the crystal lattices of first intrinsic layer 104 and substrate 102 are in alignment. A second intrinsic layer 106 of undoped InGaAs ternary material is epitaxially grown on the first intrinsic layer 104. A third intrinsic layer 108 of InGaAsP is epitaxially grown on second intrinsic layer 106. Although they are undoped, first, second, and third intrinsic layers 104, 106, 108 function as weakly n-type material; that is, n-type material with relatively few donors.

A $SiN_x$ mask 110 is formed over the third intrinsic layer 108. Next, a suitable p-type (acceptor) dopant, such as Zn, is diffused into the third intrinsic layer 108 through mask 110 to form a relatively heavily-doped p+region 112. Particular dopant concentrations for the various layers of the diode are well known to those skilled in the art. This p-type dopant is allowed to diffuse through the mask 1 10, through a portion of the third intrinsic layer 108, and into a portion of the second intrinsic layer 106. Prior art PIN diode fabrication techniques do not stop the p-type dopant diffusion process until the dopant has entered the second intrinsic layer 106. Any dopant introduced into this intrinsic region will tend reduce the internal resistance of the device. Finally, a metalized contact 114 is deposited over the p+region and the mask 110. Metallized contact 114 represents the P terminal of the PIN photodiode 100 for purposes of lead attachment. The N terminal of PIN photodiode 100 is formed by a metallized contact (not shown) to substrate 102.

In operation, the PIN photodiode structure 100 is reverse-biased. For example, the positive terminal of a voltage source, such as battery 105, may be connected to the substrate 102, and a first terminal of a load resistor 107 connected to the negative terminal of the battery 105. The second terminal of the load resistor 107 is then connected to the contact 114. A reverse bias potential of a few volts is generally sufficient to deplete first and second intrinsic layers 104 and 106 of charge carriers. As a result, in the absence of light, only a small reverse current flows through PIN photodiode 100.

Reverse bias effects a desired electric field polarity by facilitating charge carrier flow in response to illumination. In particular, when light, shown in FIG. 1 as hv, is applied through substrate 102 directed generally towards p+region 112, some of the photons are absorbed in second intrinsic layer 106. These photons generate charge carriers in the form of electron-hole pairs, so long as the bandgap of the semiconductor material is less than the energy of the incident photons. The aforementioned condition is generally met for semiconducting material of InGaAs, where the incident light is in the wavelength range of 1.3–1.55 microns. The electrons generated by this light absorption process migrate towards substrate 102, whereas the holes so generated migrate towards p-contact 114. These migrations occur due to the electric field established by the reverse bias applied to the PIN diode.

The so-called depletion region of the diode is indicated as depletion region 115. In practice, this region may not have fixed, sharply-defined boundaries and, as such, the location of the depletion region is denoted generally using dashed lines. However, it is significant to note that, in the prior art device of FIG. 1, the depletion region, namely, the region where substantially all of the charge carriers are depleted, does not extend into third intrinsic layer 108. By contrast, the depletion region 215 (FIG. 2) extends into third intrinsic layer 208. In both devices, the upper bound of the depletion region ends approximately at the interface where p+region 112, 212, respectively, meets an intrinsic layer 106, 208, respectively, because of the change in semiconductor conductivity type. If a photon is absorbed in a depletion region 115 of the diode, the migration of charge carriers results in a charge flow across an external circuit such as the load resistor mentioned above. This is true even though each type of charge carrier typically migrates a distance less than the entire width of the photodiode junction as measured from within first intrinsic layer 104 to within p+region 112.

We have recognized that the nonlinearity of the prior-art structure of FIG. 1 is a consequence of the fact that a portion of the absorption region in which photons are absorbed extends beyond depletion region 115. In PIN photodiode 100, this light absorption region comprises second intrinsic layer 106, and also subregion 128 of p+region 112, which represents the portion of second intrinsic layer 106 into which p-type impurities have been diffused. First intrinsic layer 104 is substantially transparent to light, and substantially all of the incident light is absorbed prior to reaching third intrinsic layer 108. We have thus realized that, if the absorption of a photon occurs outside of the depletion region 115, the charge carriers generated by this photon will likely recombine with a donor or acceptor impurity, and hence will not enhance the conductivity of the diode. Nonlinearities result. For example, if the absorption of a photon occurs in subregion 128 of p+region 112, the electron of the electron-hole pair will likely recombine with an acceptor impurity in p+region 112, and, hence, be unable to cause an increase in photodiode conductivity. A relatively small number of electrons will be generated within a diffusion length of the depletion region, and it is these electrons which will cause an increase in photodiode conductivity. The principal cause of nonlinearity in prior art devices has its basis in variation of the thickness of the absorption layer 106 which is depleted by the applied bias. The depleted thickness varies in prior art devices since modulation of the incident light intensity produces small changes in the effective applied bias.

An improved PIN photodiode 200 embodying the principles of the invention is shown in FIG. 2. The design of this PIN photodiode is based upon our discovery that presently-existing PIN diodes (FIG. 1) are nonlinear because some of the charge carriers generated by illumination do not change the conductivity of the diode. To reiterate the observation made above in connection with the prior-art device of FIG. 1, charge carriers generated outside of the depletion region (FIG. 1, 115) become trapped by semiconductor donors and acceptors, unable to enhance diode conductivity. Due to the fact that existing PIN diodes absorb some light in areas outside of the depletion region, and this light absorption does not lead to a corresponding change in conductivity, the photodiode exhibits nonlinearities.

Like elements of FIGS. 1 and 2 bear similar reference numbers, in that 100-series numbers are used in FIG. 1 whereas 200-series numbers are used in FIG. 2. For example, n-doped InP substrate 202 of FIG. 2 corresponds to n-doped InP substrate 102 of FIG. 1. First intrinsic layer 104 of FIG. 1 corresponds to first intrinsic layer 204 (FIG. 2). The fundamental difference between FIGS. 1 and 2 relates to the depth of p+region 112 (FIG. 1) as compared to the depth of p+region 212 (FIG. 2). P+region 212 is fabricated by forming an $SiN_x$ mask 210 over the third intrinsic layer 208. A suitable p-type (acceptor) dopant, such as Zn, is diffused into the third intrinsic layer 208 through mask 210 to form a relatively heavily-doped p+region 212. It is important to note that this p-type dopant is allowed to diffuse through the mask 210, and through a portion of the third intrinsic layer 208, but not into any portion of the second intrinsic layer 206. This differs from the prior art devices which were fabricated by continuing the p-type dopant diffusion process until the dopant had entered the second intrinsic layer 106 (FIG. 1).

In PIN photodiode 200 (FIG. 2), the absorption region is confined entirely within the depletion region 215, pursuant to the principles of the invention. Depletion region 215 is the region in which the density of charge carriers is insufficient to neutralize the fixed charge density of donors and acceptors. Light is absorbed in the absorption region which consists of second intrinsic layer 206. In contrast to the PIN photodiode 100 of FIG. 1, PIN photodiode 200 (FIG. 2) does not include a subregion 128 of p+region 112 as a portion of the absorption region. First intrinsic layer 204 is substantially transparent to light, and substantially all of the incident light is absorbed prior to reaching third intrinsic layer 208. Substantially all of the light incident upon PIN photodiode 200 is absorbed in second intrinsic layer 206. Since second intrinsic layer is situated wholly within depletion region 215, whenever a photon generates an electron-hole pair, these charge carriers will enhance the conductivity of the photodiode because they are not trapped by a donor or acceptor impurity before reaching the outer periphery of the depletion region. In other words, when a photon is absorbed within depletion region 215, the migration of charge carriers results in a flow of charge across an external circuit such as the load resistor mentioned above. For instance, in the case of charge carriers which are electrons, the electron will not be trapped prior to reaching substrate 102. In the case of holes, the hole will not be trapped prior to reaching p+region 212. This is in contrast to the prior art design of FIG. 1 where, if the absorption of a photon occurred in subregion 128 of p+region 112, the electron of the electron-hole pair would likely recombine with an acceptor impurity in p+region 112, and, hence, be unable to cause an increase in photodiode conductivity. In general, if the absorption of a photon occurs outside of the depletion region 215, the charge carriers generated by this photon will likely recombine with a donor or acceptor impurity, and, hence, will not enhance the conductivity of the diode. Therefore, it is desirable to ensure that substantially no photons will be absorbed by the PIN photodiode 200 outside of the depletion region.

The improved PIN photodiode 200 of FIG. 2 provides enhanced linearity by confining the light absorption region of the diode, second intrinsic layer 206, wholly within the depletion region 215. The photodiode exhibits improved linearity over prior art designs because the thickness of the absorption region is no longer a function of changes in the size of the depletion region during device operation. Keeping the absorption region wholly within the depletion region ensures that the charge carriers generated by incident illumination will increase the conductivity of the semiconductor material.

FIG. 3 is a chart showing the measured linearities of prior-art PIN photodiode 100 (FIG. 1) and PIN photodiode 200 (FIG. 2). Five PIN photodiodes were fabricated in accordance with FIG. 2, and these diodes are denoted as I-1, I-2, I-3, I-4, and I-5. The performance of these photodiodes was compared with that of a representative sample of a prior art PIN photodiode P-1 constructed in accordance with FIG. 1 and manufactured by the Microelectronics Group of Lucent Technologies as part number ATT 3012.

In theory, the presence of diode nonlinearities could be measured directly by generating a plot of illumination versus current. In practice, this approach is tedious and time-consuming to implement. Advantageously, however, diode linearity can be easily measured using the so-called two-tone test. We performed such a test in which each PIN diode was simultaneously exposed to two light sources each having wavelengths of approximately 1.55 micrometers. Both light sources was amplitude-modulated at 50% modulation depth, and adjusted to provide substantially equal output powers. The first source was modulated at 451.25 MHz, and the second source was modulated at 373.25 MHz. In accordance with the two-tone test, the amplitude of the sum frequency, 824.5 MHz, observed across a load resistor 107 (FIGS. 1 and 2), is a measure of the linearity of PIN diodes 100 and 200. The values tabulated in FIG. 3 are in units of dBc, which indicate the number of decibels that the amplitude of the 824.5 MHz sum product is below that of the carrier at either 451.25 MHz or 373.25 MHz, The PIN diodes constructed in accordance with FIG. 2 exhibit markedly improved linearity relative to prior art designs, especially at high levels of reverse bias. Consider, for example, diode performance with a reverse bias of 50 volts. Diode I-1, the worstperforming of the enhanced photodiodes, yielded a linearity measurement of 74.7 dBc. Diode I-2, the best-performing, yielded a linearity measurement of 79.9 dBc. These values compare very favorably to the prior art design P-1 which yielded a linearity measurement of only 68 dBc. Perfect linearity is difficult or virtually impossible to achieve due to the existence of various complicating factors. For example, the boundaries of the depletion region change dynamically during photodiode operation, thereby rendering linearity all the more difficult to achieve.

What has been described is merely illustrative of our invention. Those skilled in the art may advantageously utilize the concepts taught herein to implement other embodiments providing similar functionality without deviating from the scope and spirit of the disclosed invention.

We claim:

1. A PIN photodiode characterized by a light absorption region comprising an entire thickness of light absorption layer having a thickness that is confined wholly within the thickness of a charge carrier depletion region, wherein the charge carrier depletion region is between the PN junction and a substrate.

2. A PIN photodiode comprising:

(a) a light absorption region comprising an entire thickness of a light absorption layer for absorbing photons incident thereupon and for generating charge carriers in response thereto;

(b) a depletion region having a conductivity which is a function of charge carrier density therein;

characterized in that the thickness of the light absorption layer is confined wholly within the thickness of the depletion region, wherein the depletion region is between the PN junction and a substrate.

3. A PIN photodiode including:

(a) an absorption region comprising an entire thickness of a light absorption layer in which incident illumination generates electron-hole charge carriers, and (b) a depletion region in which the density of charge carriers is insufficient to neutralize the fixed charge density of donors and acceptors;

characterized in that the thickness of the absorption layer is confined within the thickness of the depletion region, wherein the depletion region is between the PN junction and a substrate.

4. The PIN photodiode of claim 3 wherein the depletion region is formed within one or more layers of intrinsic semiconducting material.

5. The PIN photodiode of claim 4 wherein the absorption region is confined to less than all of the one or more layers of intrinsic semiconducting material.

6. The PIN photodiode of claim 5 further comprising a first layer and a second layer of intrinsic semiconducting material, wherein the absorption region is the first layer, and at least a portion of the depletion region extends into the second layer.

7. The PIN photodiode of claim 6 wherein the PN junction is formed on the second layer by introducing p-type impurities into the second layer such that substantially none of the impurities are introduced into the first layer.

8. The PIN photodiode of claim 7 wherein the first layer is fabricated from a ternary semiconducting compound system, and the second layer is fabricated from a quaternary semiconducting compound system.

9. The PIN photodiode of claim 8 wherein the ternary semiconducting compound system is InGaAs and the quaternary semiconducting compound system is InGaAsP.

10. The PIN photodiode of claim 9 wherein the p-type impurities comprise Zn.

11. A PIN photodiode comprising:

(a) an n-type substrate layer substantially transparent to light across a specified range of wavelengths;

(b) a first intrinsic semiconductor layer adjoining the n-type substrate layer; a portion of a depletion region in which the density of charge carriers is insufficient to neutralize the fixed charge density of donors and acceptors being formed within the first intrinsic semiconductor layer;

(c) a second intrinsic semiconductor layer adjoining the first intrinsic semiconductor layer, a portion of the depletion region being formed within the second intrinsic semiconductor layer, wherein the second intrinsic semiconductor layer functions as an absorption region in which incident illumination generates electron-hole charge carriers; and (d) a third intrinsic semiconductor layer adjoining the second intrinsic semiconductor layer, the density of charge carriers in the third intrinsic semiconductor layer being insufficient to neutralize the fixed charge density of donors and acceptors being formed with that layer, the third intrinsic semiconductor layer including a first junction formed by introducing a doping impurity into the third intrinsic semiconductor layer to a depth only into the third intrinsic semiconductor layer such that substantially none of the impurities are introduced into the first and second intrinsic semiconductor layers.

* * * * *